(12) United States Patent
Wu et al.

(10) Patent No.: US 6,764,962 B2
(45) Date of Patent: Jul. 20, 2004

(54) METHOD FOR FORMING AN OXYNITRIDE LAYER

(75) Inventors: Yung-Hsien Wu, Taipei (TW); Chia-Lin Ku, Hsinchu Hsien (TW)

(73) Assignee: ProMOS Technologies, Inc., Hsinchu (TW)

( * ) Notice: Subject to any disclaimer, the term of this patent is extended or adjusted under 35 U.S.C. 154(b) by 2 days.

(21) Appl. No.: 10/162,172

(22) Filed: Jun. 5, 2002

(65) Prior Publication Data

US 2003/0077915 A1 Apr. 24, 2003

(30) Foreign Application Priority Data

Oct. 22, 2001 (TW) .......................................... 90126027 A

(51) Int. Cl.$^7$ ............................................. H01L 21/31
(52) U.S. Cl. ........................ 438/775; 438/769; 438/770
(58) Field of Search ................................ 438/775, 770, 438/769

(56) References Cited

U.S. PATENT DOCUMENTS 6,117,756 A * 9/2000 Wu ............................ 438/594
6,197,701 B1 * 3/2001 Shue et al. ................. 438/763

* cited by examiner

Primary Examiner—Alexander Ghyka
(74) Attorney, Agent, or Firm—Birch, Stewart, Kolasch & Birch, LLP

(57) ABSTRACT

A method for forming oxynitride layer. The method includes (a) providing a substrate and removing the native oxide layer; (b) forming a nitride layer on the substrate; (c) oxidizing the nitride layer to form an oxynitride layer; and (d) subjecting the oxynitride layer to in-situ annealing.

This method inhibits the penetration of boron into the substrate thereby improving the performance of semiconductor devices and production yield.

20 Claims, 2 Drawing Sheets

METHOD FOR FORMING AN OXYNITRIDE LAYER

BACKGROUND OF THE INVENTION

1. Field of the Invention:

The present invention relates to a method for forming an oxynitride layer, in particular, a method for forming an oxynitride layer to avoid boron penetration.

2. Description of the Prior Art:

In metal oxide semiconductor field effect transistors (MOSFETs), gate oxide plays a very important role, as its thickness must be continuously decreased to lower threshold voltage so that speed and current of the device are increased. Under these circumstances, boron penetration problems easily occur as the size of devices continuously decreases, especially PMOSFET with P+ polysilicon gates, wherein CMOS thereof must have low and symmetrical threshold voltage to achieve operation in low voltage. However, boron ions from the P+ polysilicon gate easily penetrate to the silicon substrate at the bottom. This not only shifts the threshold voltage to the positive direction, but also lowers the sub-threshold swing, which seriously affects the characteristics of time-dependent dielectric breakdown. Consequently, boron penetration must be overcome to obtain semiconductor devices that meet the operational requirements.

A few research papers have disclosed methods for improving oxynitride layers, such as forming an $NH_3$-rich layer so that nitrogen accumulates at the surface of the oxide layer and the interface of oxide layer and silicon substrate, thereby inhibiting dopant diffusion. For hydrogen-related species, however, electron trapping problems can occur.

Another method discloses using $N_2O$ instead of $NH_3$, but high thermal budget must be obtained to provide sufficient nitrogen concentration to achieve inhibition of boron penetration. If the thickness of the oxide layer is less than 35 Å, using $N_2O$ cannot effectively solve the boron penetration problem. In another method, using NO, although there is no thermal budget problem as above, the maximum value of the nitrogen concentration located at the interface brings fixed-charge buildup. This, more or less, results in boron penetration to the oxide layer, which consequently affects the performance of the device. The optimum gate oxide layer must have a nitrogen diffusion barrier at the interface, and avoid boron penetration at the same time. A good oxide interfacial quality is then sufficient to maintain carrier mobility and transconductance.

In order to achieve the nitrogen profile, i.e. high nitrogen concentration at the interface, methods disclosed are nitridation of thermal oxide layer using high density of $N_2$ plasma, and $N_2$ ion implanting before oxidizing. However, nitridation with high density of $N_2$ plasma is not compatible with the current process, and the latter method is more complicated, thus difficult to integrate with the current process. Moreover, defects associated with ion implantation can affect the quality of the oxide layer.

SUMMARY OF THE INVENTION

In order to overcome the above problems, an object of the invention is to provide a method for forming an oxynitride layer, using dry oxidation to form an oxynitride layer in a low-pressure state. Not only are the problems associated with boron penetration inhibited, promoting device quality, the method provided is also compatible with the current process.

In order to achieve the above objects, there is provided a method for forming an oxynitride layer, comprising: (a) providing a substrate and removing the native oxide layer; (b) forming a nitride layer on the substrate; (c) oxidizing the nitride layer to form an oxynitride layer; and (d) subjecting the oxynitride layer to in-situ annealing.

Native oxide layer removal in step (a) is accomplished by buffered oxide etching (BOE) solution, such as HF or $NH_4F$. In step (b), the nitride layer is formed by thermal nitridation, where the parameters are as follows: pressure less than 10 torr, in 800~1000° C. of $NH_3$ gas. The nitride layer formed is 10~15 Å thick, preferably 13 Å. Oxidation of nitride layer in step (c) is carried out in atmospheric $O_2$, where the temperature is 900~950° C. In-situ annealing in step (d) is performed in $N_2$ gas, where the temperature is 900° C. The oxynitride formed is 25~30 Å thick, preferably 28 Å.

According to the invention, the peak value (5.11E21 atoms/cm$^3$) of nitrogen concentration in the oxynitride layer formed is located at the interface of the oxynitride layer, i.e. the interface with the polysilicon layer formed thereafter. The peak value has shifted from the interface of oxide layer and the substrate to the interface of polysilicon/oxynitride. Consequently, it inhibits boron penetrates from the P+ polysilicon electrode into the gate oxide layer. Nitrogen concentration at the interface of the oxynitride layer also enhances the overall reliability of the device.

In addition, based on the results observed by Secondary Ion Mass Spectroscopy (SIMS), it is considered that the profile of nitrogen distributed in theoxynitride layer not only inhibits boron penetration, but also achieves accurate control of the thickness of the oxynitride layer.

The present invention will become more fully understood from the detailed description given hereinbelow and the accompanying drawings, given by way of illustration only and thus not intended to be limitative of the present invention.

DETAILED DESCRIPTION OF THE INVENTION

Figure 1:
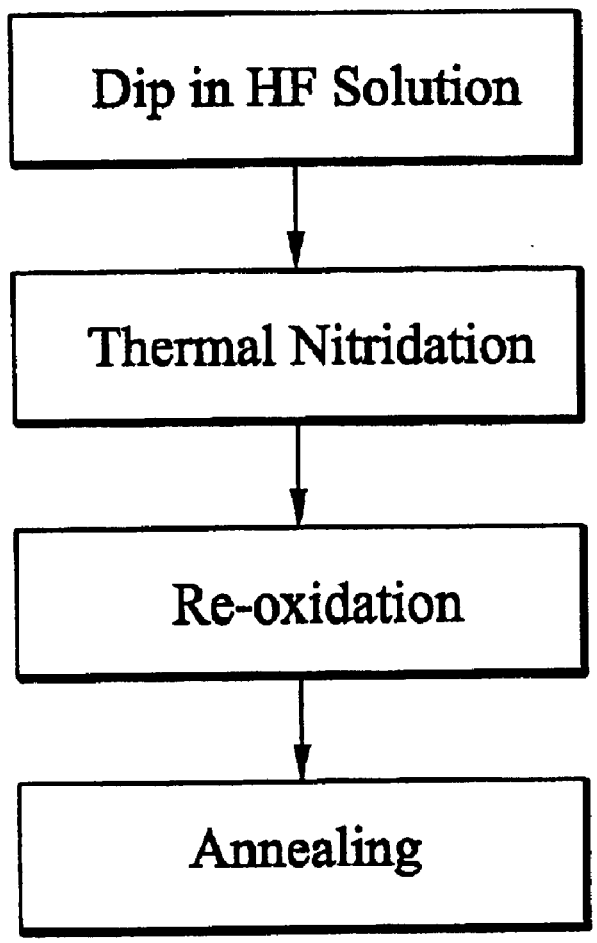
FIG. 1 is a flowchart of the method for forming an oxynitride layer according to the invention.

According to the method for forming an oxynitride layer of the invention, the procedure is shown as a flowchart in FIG. 1, where a silicon substrate is sequentially dipped in HF solution, thermal nitridated, re-oxidated and annealed.

Firstly, a silicon wafer was dipped in HF solution to remove native oxide, followed by forming an oxynitride layer on the silicon wafer by thermal nitridation and dry oxidation. Thermal nitridation was carried out by low pressure chemical vapor deposition (LPCVD) in $NH_3$ gas. Operating pressure and temperature were 6 torr and 900° C. respectively, and the time was 30 min. The LPCVD device also includes a rapid thermal processor with a temperature ramp of 100° C./min, ten times that of a conventional furnace. After thermal nitridation, thickness of the nitride layer formed was measured by an ellipsometer, which was 13 Å and the thickness uniformity is less than 3%. Next, the nitride layer was reoxidized in atmospheric $O_2$ at 900° C. to form an oxynitride layer. Finally, the oxynitride layer was kept at the same temperature in $N_2$ gas and annealed for 10 mins. Again, the obtained oxynitride layer was measured for thickness and uniformity by an ellipsometer. The thickness is 28 Å and the thickness is uniform.

Figure 2:
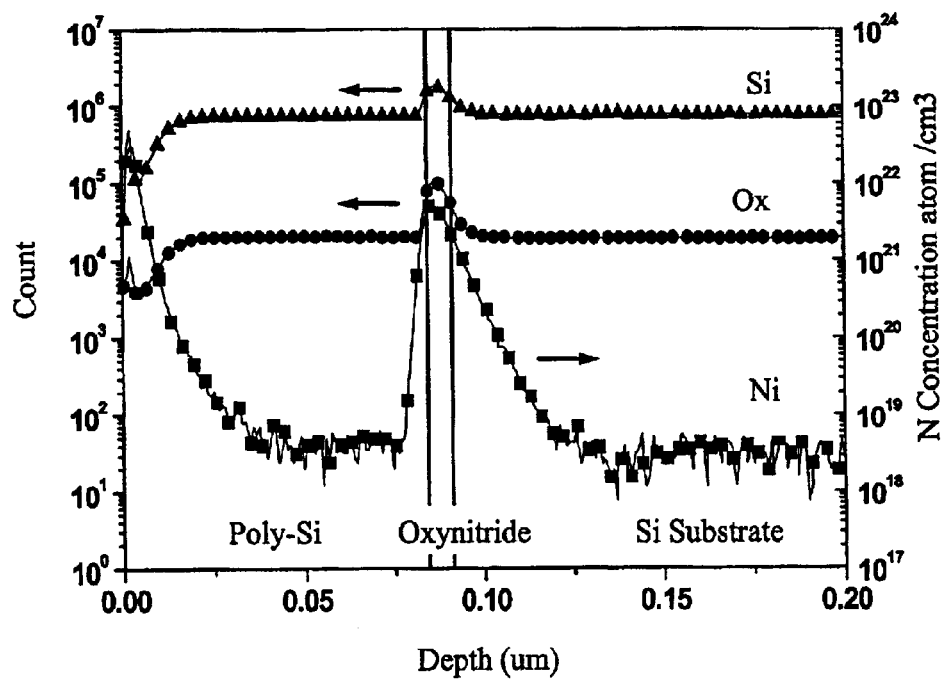
FIG. 2 is a graphical representation of the concentration distribution of various elements according to the embodiment of the invention.

After these steps, a polysilicon layer was formed on the oxynitride layer to avoid difficulties in quantitative analysis caused by different sputtering speed on the surface. SIMS analysis was used in this embodiment to analyze concentration distribution of various elements on the silicon substrate, as shown in FIG. 2, where X axis represents the overall depth across the polysilicon/oxynitride/silicon substrate, and Y axis represents amount (left) and concentration of nitrogen (right).

Figure 3:
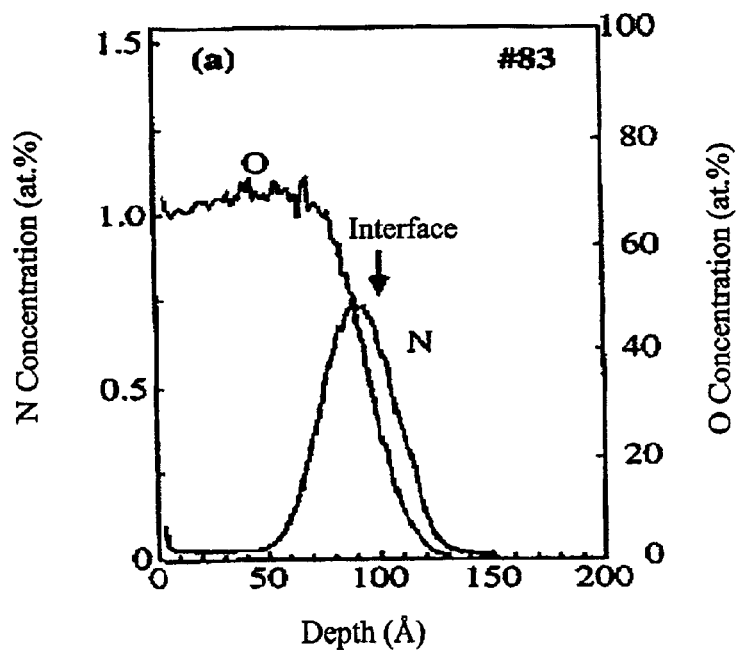
FIG. 3 is a graphical representation of the concentration distribution of oxygen and nitrogen according to prior art.

In order to emphasis the differences between this invention and prior art, FIG. 3 is a graphical representation of concentration distribution of O and N in the oxynitride layer, where X axis represents the depth of oxide layer/silicon substrate, the arrow indicates the interface of the two and Y axis represents N concentration (left) and O concentration (right). It is observed from FIG. 2 that the peak value of nitrogen is 5.11E21 atoms/cm$^3$, located at the surface of the oxynitride layer, i.e. the interface with the polysilicon layer. This feature is the most significant aspect of this invention. In comparison to prior art, where the peak value of N concentration is usually located between the oxide layer and the substrate, the oxynitride obtained in this invention is able to inhibit boron penetration from P+ polysilicon electrode to the gate oxide. As a result, device reliability is greatly improved.

In addition, the peak value of 5.11E21 atoms/cm$^3$ obtained in this invention is much higher than that of conventional art (1.42E21, 2.85E20), as shown in Table 1. Furthermore, the oxynitride of the invention is obtained by the penetration of oxygen into the nitride layer, thus the interface between the oxynitride layer and silicon substrate is much more uniform.

TABLE 1

|  | Oxidation of NO by RTP at 1000° C. for 10 sec | Oxidation of $N_2O$ by RTP at 1000° C. for 100 sec | Embodiment |
| --- | --- | --- | --- |
| Peak value of N concentration (atoms/cm$^3$) | 1.42E21 | 2.85E20 | 5.11E21 |

Judging from the results obtained, the method for forming an oxynitride provided in the invention is able to enhance both the performance and the reliability of semiconductor devices by forming sufficient concentration of nitrogen on the surface of the oxide layer to effectively inhibit boron penetration. Also, the thickness of the obtained gate oxide layer is uniform, which further contributes to the improvement of the device characteristics. Most importantly, this method can be easily and fully integrated with the current process without any complications.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A method for forming an oxynitride layer, comprising:
    (a) providing a substrate and removing the native oxide layer;
    (b) forming a nitride layer on the substrate by thermal nitridation;
    (c) oxidizing the nitride layer to form an oxynitride layer; and
    (d) subjecting the oxynitride layer to in-situ annealing.

2. The method as claimed in claim 1, wherein in step (a), the native oxide layer is removed by dipping the substrate in a buffered oxide etching (BOE) solution.

3. The method as claimed in claim 2, wherein the BOE solution is HF or $NH_4F$.

4. The method as claimed in claim 1, wherein the thermal nitridation is carried out in $NH_3$ gas at pressure less than 10 torr, and temp of 800~1000° C.

5. The method as claimed in claim 1, wherein the nitride layer formed in step (b) is 13 Å thick.

6. The method as claimed in claim 1, wherein the oxidation in step (c) is carried out in atmospheric $O_2$.

7. The method as claimed in claim 6, wherein the oxidation temperature is 900° C.

8. The method as claimed in claim 1, wherein the in-situ annealing of step (d) is carried out in $N_2$ gas.

9. The method as claimed in claim 7, wherein the temperature of the in-situ annealing is 900° C.

10. The method as claimed in claim 1, wherein the thickness of the oxynitride layer is 28 Å.

11. A method for forming a gate dielectric layer, comprising:
    (a) providing a substrate and removing the native oxide layer;
    (b) forming a nitride layer on the substrate by thermal nitridation;
    (c) oxidizing the nitride layer to form an oxynitride layer; and
    (d) subjecting the oxynitride layer to in-situ annealing to form the gate dielectric layer.

12. The method as claimed in claim 11, wherein in step (a), the native oxide layer is removed by dipping the substrate in a buffered oxide etching (BOE) solution.

13. The method as claimed in claim 12, wherein the BOE solution is HF or $NH_4F$.

14. The method as claimed in claim 11, wherein the thermal nitridation is carried out in $NH_3$ gas at pressure less than 10 torr, and temp of 800–1000° C.

15. The method as claimed in claim 11, wherein the nitride layer formed in step (b) is 13 Å thick.

16. The method as claimed in claim 11, wherein the oxidation in step (c) is carried out in atmospheric $O_2$.

17. The method as claimed in claim 16, wherein the oxidation temperature is 900° C.

18. The method as claimed in claim 11, wherein the in-situ annealing of step (d) is carried out in $N_2$ gas.

19. The method as claimed in claim 18, wherein the temperature of the in-situ annealing is 900° C.

20. The method as claimed in claim 11, wherein the thickness of the oxynitride layer is 28 Å.

* * * * *